United States Patent [19]
Nii et al.

[11] Patent Number: 5,169,493
[45] Date of Patent: Dec. 8, 1992

[54] METHOD OF MANUFACTURING A THICK FILM RESISTOR ELEMENT

[75] Inventors: Minoru Nii; Yoshitaka Fukuoka, all of Kanagawa, Japan

[73] Assignee: Kabushiki Kaisha Toshiba, Kawasaki, Japan

[21] Appl. No.: 509,188

[22] Filed: Apr. 16, 1990

[30] Foreign Application Priority Data

May 18, 1989 [JP] Japan .................. 1-124669

[51] Int. Cl.$^5$ .............................................. C23C 26/00
[52] U.S. Cl. .................. 156/659.1; 156/656; 156/901; 427/102; 427/307
[58] Field of Search .................. 427/102, 307; 156/659.1, 656, 901

[56] References Cited

U.S. PATENT DOCUMENTS

| | | | |
|---|---|---|---|
| 2,748,234 | 5/1956 | Clarke | 427/102 |
| 3,366,519 | 1/1968 | Pritchard | 427/307 |
| 3,699,650 | 10/1972 | Cocca | 427/102 |
| 4,140,817 | 2/1979 | Brown | 427/102 |
| 4,205,392 | 5/1980 | Byrum, Jr. | 315/169.4 |
| 4,241,103 | 12/1980 | Ohkubo | 427/103 |
| 4,316,920 | 2/1982 | Brown | 427/102 |
| 4,503,090 | 3/1985 | Brown | 427/102 |
| 4,539,223 | 9/1985 | Hormadaly | 427/102 |

Primary Examiner—Shrive Beck
Assistant Examiner—Vi Duong Dang
Attorney, Agent, or Firm—Oblon, Spivak, McClelland, Maier & Neustadt

[57] ABSTRACT

A conductive paste layer of less than 5 μm is formed on an insulating substrate. After a drying and a baking treatment of the conductive paste layer, an etching is carried out to form a plurality of electrode pairs. Resistor layers are formed corresponding to each pair of the electrodes so as to partially overlap with the electrodes.

9 Claims, 3 Drawing Sheets

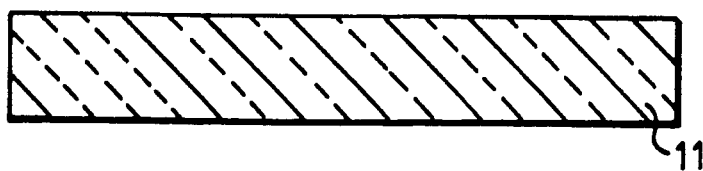
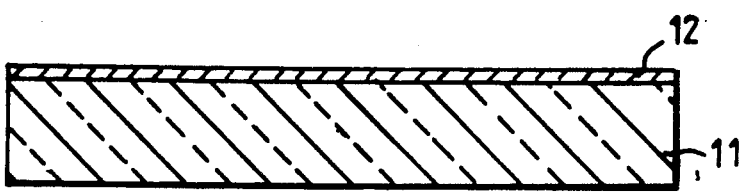
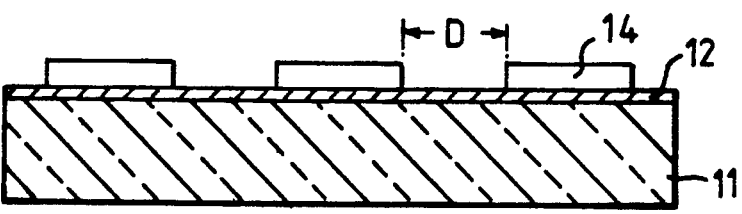
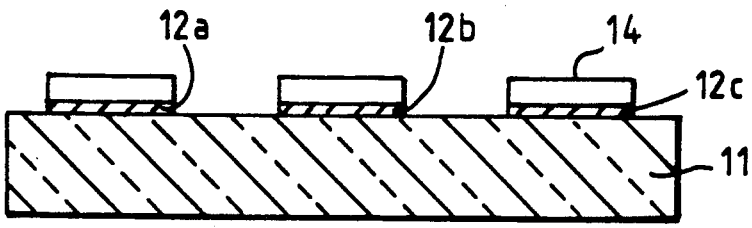
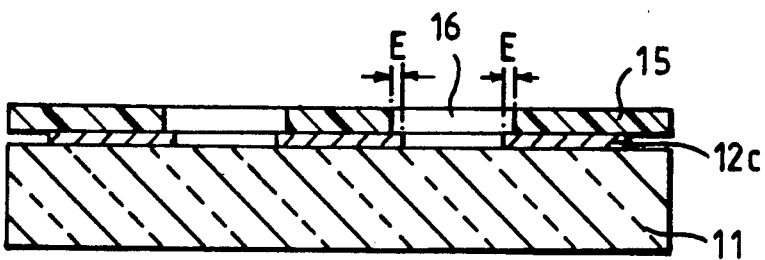
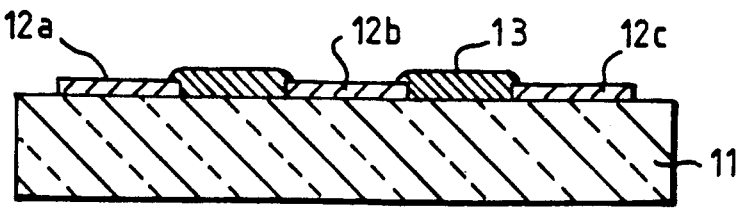

5,169,493

METHOD OF MANUFACTURING A THICK FILM RESISTOR ELEMENT

BACKGROUND OF THE INVENTION

1. Field of the Invention

This invention concerns a method of manufacturing a thick film resistor element. More particularly, this invention concerns a method of manufacturing a thick film resistor element which provides an accurate resistance value.

2. Description of the Prior Art

Conventionally, a thick film resistor element is formed by use of a printing method.

For example, first, an alumina substrate is prepared. Then, a plurality of electrode pairs, e.g., thicker than 10 $\mu m$, are formed on the substrate using a thick film printing method. Specifically, a conductive paste layer is applied to the substrate through a screen mask, followed by a drying and a baking treatment.

Next, a plurality of resistive layers are formed using the thick film printing method. These resistance layers correspond to each pair of electrodes so as to partially overlap the electrodes at the end portions thereof.

Then, the substrate is divided into a plurality of chips by scribing techniques so as to produce usable chips.

FIG. 1 is a plan view of a thick film resistor device in which a plurality of thick resistor elements are formed in an array form. For convenience of description, the relationship between the electrodes 2a and 2b and the resistor layers 3 (right column) is illustrated in FIG. 1 as if the resistor layers 3 are transparent, while in actual practice there are not.

FIG. 2 is a cross sectional view taken along the line I—I in FIG. 1. In the drawings, numeral 1 designates an alumina substrate, and 2a, 2b and 2c are electrodes. Numeral 3 designates a resistor element which extends so as to overlap with the electrodes 2a, 2b and 2c partially at the end portions thereof.

In the above described conventional thick resistor elements, the accuracy of the resistance of the resistor elements is poor. Thus, trimming is usually required to achieve a desired resistance value.

The inventors discovered that the deterioration of the resistance value is mainly due to the distortion of the resistor layer. Namely, since the electrode layers 2a, 2b and 2c are relatively thick, e.g., thicker than 10 $\mu m$, the shape of the resistor elements is distorted due to the overlap between the resistor layers 3 and the electrode layers. As the chip size becomes smaller and smaller, the influence of the distortion on the resistance value becomes more and more conspicuous.

Thus, the inventors attempted reducing the thickness of the electrode layers. The inventors used a screen mask of less than 5 $\mu m$ to reduce the thickness of the electrode layers.

However, small notches 4 were observed at the edge of the electrodes layers, as shown in FIG. 1. The notches are formed because of the mesh construction found in the screen mask used (not shown). The influence of the small notches to the resistance value becomes serious when the chip size becomes small, e.g., 1 $mm^2$. As a result, the accuracy of the resistance value becomes less.

SUMMARY OF THE INVENTION

Therefore, an object of the present invention is to provide a method which can provide a thick film resistor element having an accurate resistance value.

To achieve the object, the present invention provides a method of manufacturing a thick film resistor element, comprising the steps of: preparing an insulating substrate having a main surface; forming a conductive layer on the main surface; forming a first and a second electrode having a predetermined distance therebetween by selectively etching the conductive layer; and forming a resistive layer having first and second edges which overlying the first and the second electrodes.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings:

FIGS. 3A, 3B, 3C, 3D, 3E, 3F are cross sectional views illustrating an embodiment of the present invention;

DETAILED DESCRIPTION OF THE INVENTION

Figure 1:
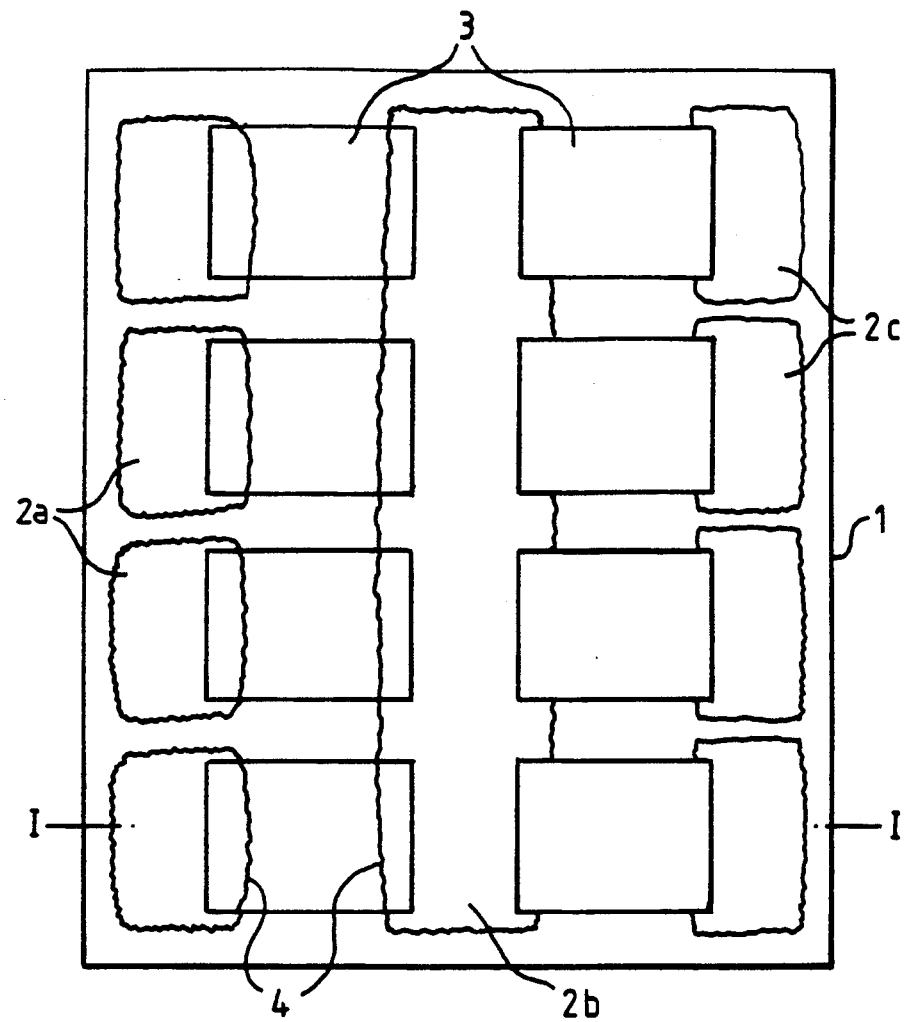
FIG. 1 is a plan view of a conventional thick film resistor elements.

Referring now to FIGS. 3A to 3F, a method of manufacturing a thick film resistor element according to an embodiment of the present invention will be explained.

At first, an insulating ceramic substrate 11, e.g., an alumina substrate of 0.4 mm, is prepared. (FIG. 3A)

Then, a conductive paste layer of about 4 $\mu m$ containing, e.g., Au powders, is applied to the substrate 11. Next, a drying and a baking treatment is carried out to form a conductive layer 12. The drying treatment is carried out for about 10 minutes at a temperature of between 100° and 120° C., and the baking treatment is carried out for about 30 minutes at a temperature of between 700° and 900° C. (FIG. 3B)

Next, a photoresist layer 14 is selectively formed on the conductive layer 12. (FIG. 3C) The distance D between the adjacent photoresist layers is 0.5 mm, for example.

Then, the conductive layer 12 is selectively removed by an etching process using the photoresistor layer 14 as a mask layer to form electrode layers 12a and 12b which form a plurality of pairs therebetween. (FIG. 3D)

Next, the photoresist layer 14 is removed, and a screen mask 15 having openings 16 is positioned on the substrate. (FIG. 3E) For example, the dimension of the opening is chosen to expose the edges of the electrode layers 12a and 12b about 0.1 mm, designated by E, respectively.

Then, a conductive paste layer containing, e.g., ruthenium tetraoxide powders, is applied on the substrate 11 through the opening 16 of the screen mask 15. After the screen mask 15 is removed, a drying and a baking treatment is carried out to form resistor elements 13. The resistor elements 13 overlap with the electrode layer 12a and 12b partially according to the dimension E in FIG. 3E. The drying treatment is carried out for about 10 minutes at a temperature of between 100° and 120° C., and the baking treatment is carried out for about 30 minutes at a temperature of between 700° and 900° C. (FIG. 3F)

Then, the substrate 11 is divided into a plurality of chips by scribing along predetermined scribe lines (not shown).

Figure 2:
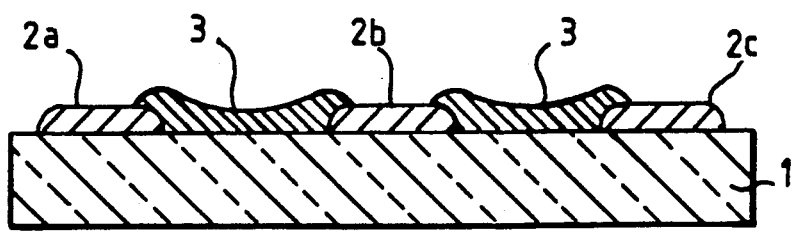
FIG. 2 is a cross sectional view along the line I—I in FIG. 1.
Figure 4:
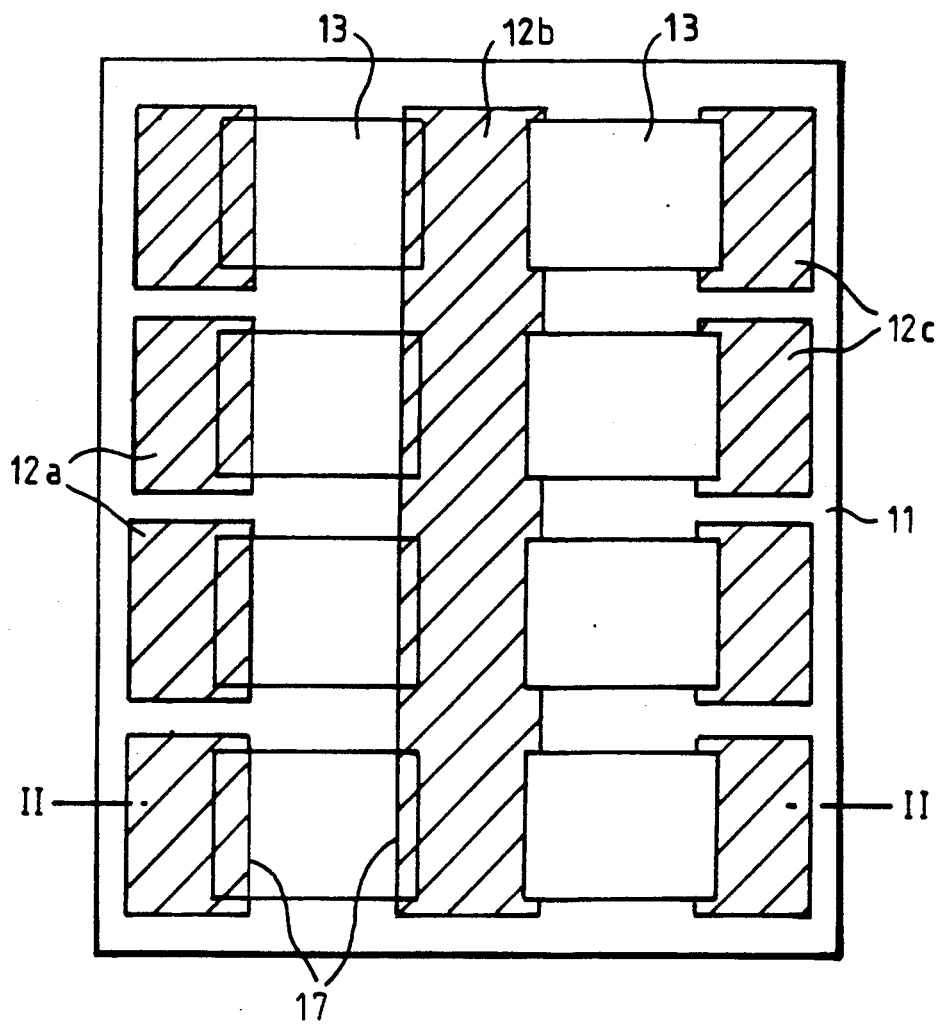
FIG. 4 is a plan view of a resistor element produced by a method according to the present invention.
Figure 5:
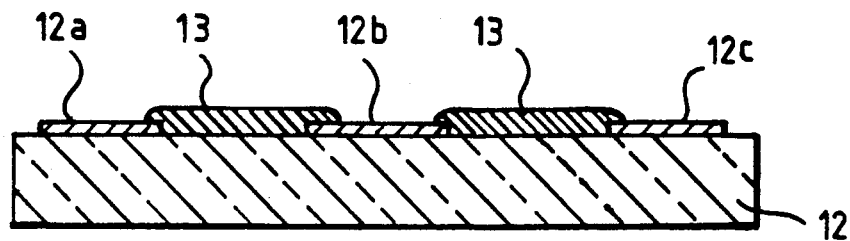
FIG. 5 is a cross sectional view along the line II—II in FIG. 4.

FIG. 4 is a plan view of a thick film resistor element formed by a method of the present invention, and FIG. 5 is a cross sectional view taken along the line II—II of FIG. 4. As in to FIG. 1, the relationship between the electrodes 12a and 12b and the resistor layers 13 (right column) is illustrated as though the resistor layers 13 are transparent. As shown in FIG. 5, the thick film resistor element 13 is of a uniform thickness compared with the conventional thick resistor element of FIG. 2.

Furthermore, the edges 17 of the electrode layer 12a, 12b and 12c are sharpened, since the electrode layers are formed by etching.

The inventors found that the accuracy of the resistance is significantly improved when the thickness of the electrode layer 12a and 12b is less than about 5 μm. For example, the yield of the elements which have a resistance value accuracy within ±20% was more than 99% when the distance D between the electrodes is 0.5 mm, the thickness of the electrode layer is 4 μm and there is 0.1 mm overlap of the resistor layer 13 and the electrode layers. This yield is sufficient for practical use as pull-up resistors in a digital circuit without trimming.

In the aforementioned embodiment, the conductive layer 12 for the electrodes is initially formed over the entire substrate 11. However, it is possible to selectively form the conductive layer through a screen mask following an etching process, using a photoresist layer to sharpen the sides of the remaining conductive layers.

Furthermore, an alumina substrate is used in the aforementioned embodiment. However, other insulating ceramic substrates may be used for the substrate.

The present invention have been described with respect to a specific embodiment. However, other embodiments based on the principles of the present invention should be obvious to those of ordinary skill in the art. Such embodiments are intended to be covered by the claims.

What is claimed is:

1. A method of manufacturing a thick film resistor element, comprising the steps of:
   preparing an insulating substrate having a main surface by forming a conductive layer on the main surface, said forming said conductive layer includes applying a conductive paste less than 5 μm thick on the main surface;
   forming a first and a second electrode having a predetermined distance therebetween by selectively etching the conductive layer; and
   forming a resistive layer having first and second edges overlying the first and the second electrodes by a predetermined distance.

2. The method of claim 1, wherein the step of forming the conductive layer comprises the steps of:
   forming a conductive paste layer containing Au powders,
   drying the conductive paste layer at a first temperature, and
   heating the conductive paste layer at a second temperature higher than the first temperature.

3. The method of claim 1, wherein the step of forming the resistive layer comprises the steps of:
   depositing a screen mask having a predetermined opening on the conductive layer,
   applying a conductive paste layer containing ruthenium tetraoxide powders through the opening of the screen mask so that said conductive paste partially overlaps with the first and the second electrode,
   drying the conductive paste layer at a third temperature, and
   heating the conductive paste layer at a fourth temperature higher than the third temperature.

4. The method of claim 1, wherein forming a conductive layer on the main surface comprises:
   applying a conductive paste as a planar layer over said insulating substrate;
   drying said paste at a first predetermined temperature; and
   baking said paste at a second predetermined temperature.

5. The method according to claim 1, wherein forming said resistive layer comprises:
   placing a screen mask on said first and second electrodes having an opening such that a predetermined length of adjacent edges of respective first and second electrodes is exposed;
   applying a conductive paste layer through said opening of said screen mask; and
   drying and baking said conductive paste layer.

6. The method of claim 5, wherein:
   said predetermined distance is approximately 0.1 mm;
   a thickness of said first and second electrodes is a 4 microns; and
   a distance between said first and second electrodes is 0.5 mm.

7. A method of manufacturing a thick film resistor element, comprising the steps of:
   preparing an insulating substrate having a main surface;
   forming a conductive layer on the main surface using screen printing thereby forming a plurality of electrode portions; p1 selectively forming a photoresist layer on each of said electrode portions while leaving edges of said electrode portions exposed;
   etching said exposed edges of said electrode portions; and
   forming a resistive layer having first and second edges overlying said electrode portions by a predetermined distance.

8. The method according to claim 7, wherein forming said resistive layer comprises:
   placing a screen mask on said first and second electrodes having an opening such that a predetermined length of adjacent edges of respective first and second electrodes is exposed;
   applying a conductive paste layer through said opening of said screen mask; and
   drying and baking said conductive paste layer.

9. The method of claim 8, wherein:
   said predetermined distance is approximately 0.1 mm;
   a thickness of said first and second electrodes is 4 microns; and
   a distance between said first and second electrode is 0.5 mm.

* * * * *